(12) United States Patent
Aude et al.

(10) Patent No.: US 12,143,105 B2
(45) Date of Patent: Nov. 12, 2024

(54) LEVEL SHIFTER

(71) Applicant: TEXAS INSTRUMENTS INCORPORATED, Dallas, TX (US)

(72) Inventors: Arlo Aude, Issaquah, WA (US); Alex Wu, Federal Way, WA (US); Madusudanan Srinivasan Gopalan, Issaquah, WA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 18/175,975

(22) Filed: Feb. 28, 2023

(65) Prior Publication Data

US 2024/0291489 A1   Aug. 29, 2024

(51) Int. Cl.
*H03K 19/0185* (2006.01)
(52) U.S. Cl.
CPC ............... *H03K 19/018514* (2013.01)
(58) Field of Classification Search
None
See application file for complete search history.

(56) References Cited

U.S. PATENT DOCUMENTS

| | | | |
|---|---|---|---|
| 7,362,624 B2* | 4/2008 | Sun | G11C 7/1057 365/189.11 |
| 7,468,615 B1* | 12/2008 | Tan | H03K 19/018528 327/333 |
| 7,880,526 B2* | 2/2011 | Acharya | H03K 19/018521 327/333 |
| 8,975,942 B2* | 3/2015 | Bardsley | H03K 5/135 326/62 |

OTHER PUBLICATIONS

Tan et al., "Low Power CMOS Level Shifters by Bootstrapping Technique," Electronics Letters, Aug. 1, 2002, vol. 38, No. 16, pp. 876-878.

* cited by examiner

*Primary Examiner* — Jeffrey S Zweizig
(74) *Attorney, Agent, or Firm* — John R. Pessetto; Frank D. Cimino

(57) ABSTRACT

In examples, an apparatus includes a first transistor, voltage source, resistor, second transistor, third transistor, and capacitor. The first transistor has a first gate, first source, and first drain, in which the first source is coupled to a first voltage terminal. The resistor is coupled between the first gate and the voltage source. The voltage source is coupled between the resistor and the first voltage terminal. The second transistor has a second gate, a second source, and a second drain, in which the second gate is coupled to the first drain, and the second source is coupled to the first voltage terminal. The third transistor has a third gate, a third source, and a third drain, in which the third drain is coupled to the second drain, and the third source is coupled to a ground terminal. The capacitor is coupled between the first drain and the third gate.

20 Claims, 9 Drawing Sheets

LEVEL SHIFTER

BACKGROUND

A level shifter is a circuit, component, or device that translates a received input signal from a first voltage domain or logic level to a second voltage domain or logic level for providing as an output signal. The output signal may be greater in value than the input signal or lesser in value than the input signal. A level shifter may be uni-directional or bi-directional and may facilitate compatibility between components or devices that may otherwise not be compatible based on their respective voltage specifications (e.g., such as the respective voltage domains in which the components operate).

SUMMARY

In some examples an apparatus includes a first transistor, a voltage source, a resistor, a second transistor, a third transistor, and a capacitor. The first transistor has a first gate, a first source, and a first drain, in which the first source is coupled to a first voltage terminal. The resistor is coupled between the first gate and the voltage source. The voltage source is coupled between the resistor and the first voltage terminal. The second transistor has a second gate, a second source, and a second drain, in which the second gate is coupled to the first drain, and the second source is coupled to the first voltage terminal. The third transistor has a third gate, a third source, and a third drain, in which the third drain is coupled to the second drain, and the third source is coupled to a ground terminal. The capacitor is coupled between the first drain and the third gate.

In some examples an apparatus includes a voltage source, a first transistor, a second transistor, a third transistor, a fourth transistor, a capacitor, and a fifth transistor. The first transistor has a first gate, a first source, and a first drain, in which the first source is coupled to a first voltage terminal. The second transistor has a second gate, a second source, and a second drain, in which the second gate is coupled to the first drain, and the second source is coupled to the first voltage terminal. The third transistor has a third gate, a third source, and a third drain, in which the voltage source is coupled between the third gate and the first voltage terminal, and the third source is coupled to the second drain. The fourth transistor has a fourth gate, a fourth source, and a fourth drain, in which the fourth gate is coupled to a second voltage terminal, and the fourth drain is coupled to the third drain. The fifth transistor has a fifth gate, a fifth source, and a fifth drain, in which the capacitor is coupled between the fifth gate and the first drain, the fifth drain is coupled to the fourth source, and the fifth source is coupled to a ground terminal.

In some examples, a system includes a circuit. The circuit includes a first transistor, a second transistor, a third transistor, a capacitor, and a fourth transistor. The first transistor has a first gate, a first source, and a first drain, in which the first source is coupled to a first voltage terminal. The second transistor has a second gate, a second source, and a second drain, in which the second gate is coupled to the first drain, and the second source is coupled to the first voltage terminal. The third transistor has a third gate, a third source, and a third drain, in which the third drain is coupled to the second drain, and the third source is coupled to a ground terminal. The capacitor is coupled between the first drain and the third gate. The fourth transistor has a fourth gate, a fourth source, and a fourth drain, in which the fourth gate is coupled to a first control terminal, the fourth source is coupled to the first voltage terminal, and the fourth drain is coupled to the first drain.

DETAILED DESCRIPTION

Figure 1:
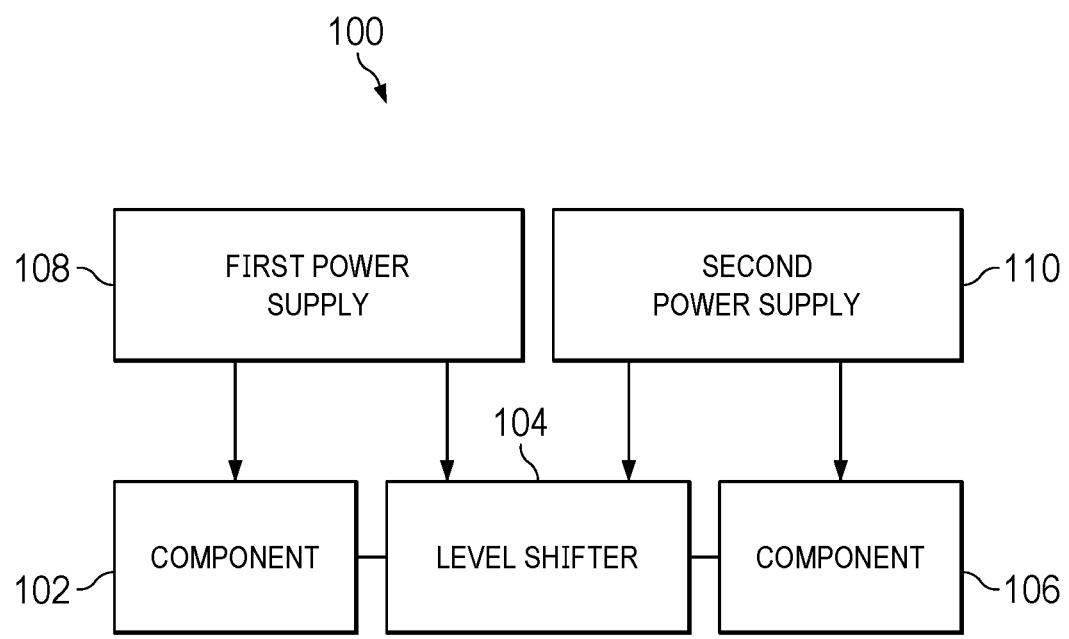
FIG. 1 is a block diagram of an example system for implementing level shifting.

As described above, a level shifter may facilitate voltage compatibility between components that may otherwise operate in voltage domains or voltage ranges that are incompatible with one another. In some cases, the voltage domains are low voltage and high voltage domains, respectively. For example, the low voltage domain may have an upper limit of less than or equal to about 1.1 volts (V) and the high voltage domain may have a lower limit greater than or equal to about 1.8 V. In various other cases, other suitable voltage ranges are possible for the low voltage domain and/or the high voltage domain.

Various challenges may exist in level shifter architecture design. For example, drain leakage of components of the level shifter may cause voltages provided in the level shifter to drift to values that may adversely affect operation of the level shifter. In another case, components of the level shifter may have a safe operating range or maximum voltage rating greater than or equal to a maximum voltage of the high voltage domain. However, this may lead to overdesign in which at least some of the components have a safe operating range larger than necessary for operation of the level shifter. This overdesign may lead to an increased size of the level shifter, increased cost of the level shifter, and/or decreased speed of operation of the level shifter. In another case, at least some nodes of the level shifter may not be initialized at start up of the level shifter and until a first edge of an input signal of the level shifter has arrived. This may cause the nodes to initialize in the wrong state, resulting in a glitch in an output signal of the level shifter and/or one or more components of the level shifter being subjected to overvoltage conditions.

A level shifter according to this description at least partially mitigates the effects of and/or compensates for these challenges. The level shifter includes a cross-coupled input transistor pair. In an example, pull-down resistors are coupled between the drains of the cross-coupled input pair and a bias source. In some examples, the bias source has a programmed voltage having a relationship to the high voltage domain and the low voltage domain (e.g., the bias source may have a voltage approximately equal to a value of a supply of the high voltage domain minus a value of a supply of the low voltage domain). The pull-down resistors and bias source may reduce drain leakage of the cross-coupled input pair, mitigating drift of voltage provided at the drains of the cross-coupled input pair. In another example, an output stage of the level shifter is implemented as an output device and a protection device in a cascode arrangement. The output device and the protection device may have a maximum voltage rating approximately equal to a maximum voltage of the low voltage domain. Implementing the output stage using devices with maximum voltage ratings based on the low voltage domain rather than the high voltage domain may reduce a size of the level shifter and increase a maximum operating speed of the level shifter. In another example, a pull-up device may be coupled in parallel with the cross-coupled input pair. The pull-up device may pull up a drain of a first transistor of the cross-coupled input pair to initialize a node coupled to the drain until a first edge of an input signal of the level shifter is received. In some examples, a dummy device may be coupled in parallel with a second transistor of the cross-coupled input pair, such as to approximately match parasitic characteristics provided at the drains of each transistor of the cross-coupled input pair. The pull-up device may prevent the drain of the first transistor from not being initialized and glitches occurring in an output signal of the level shifter.

FIG. 1 is a block diagram of an example system 100 for implementing level shifting. In at least some examples, the system 100 is representative of, or implemented in, an automobile or other vehicular environment in which certain components may operate in, or according to, a first voltage domain and other components may operate in, or according to, a second voltage domain, a laptop computer, a smartphone, a wearable device, a tablet device, or the like. In an example, the system 100 includes a component 102, a level shifter 104, and a component 106. The system 100 may also include, or be coupled to, a first power supply 108 and a second power supply 110. In at least some examples, the component 102 receives power from the first power supply 108 and operates in the first voltage domain. Similarly, the component 106 receives power from the second power supply 110 and operates in the second voltage domain. Generally, the component 102 and the component 106 may not be interoperable with one another resulting from their operation in different voltage domains. For example, a digital output signal provided by the component 102 having a first value may be interpreted by the component 106 as having a value other than the first value resulting from the component 102 and the component 106 operating in different voltage domains.

To provide interoperability between the component 102 and the component 106, in at least some examples, the level shifter 104 is coupled between the component 102 and the component 106, as well as coupled to both the first power supply 108 and the second power supply 110. The level shifter 104 may translate between the first voltage domain and the second voltage domain. For example, in some implementations the level shifter 104 receives an input signal from the component 102 having a value specified according to the second voltage domain and provides an output signal to the component 106 having a value specified according to the first voltage domain. In this way, if the value specified according to the second voltage domain is representative of a first digital value, the value specified according to the first voltage domain is also representative of the first digital value. Similarly, if the value specified according to the second voltage domain is representative of a second digital value, the value specified according to the first voltage domain is also representative of the second digital value. As described above, in some examples, the level shifter 104 includes a pull-down device, an output stage including devices having a maximum voltage rating based on a lower voltage domain from among the first voltage domain and the second voltage domain, and a pull-up device, each as described in greater detail below.

Figure 2:
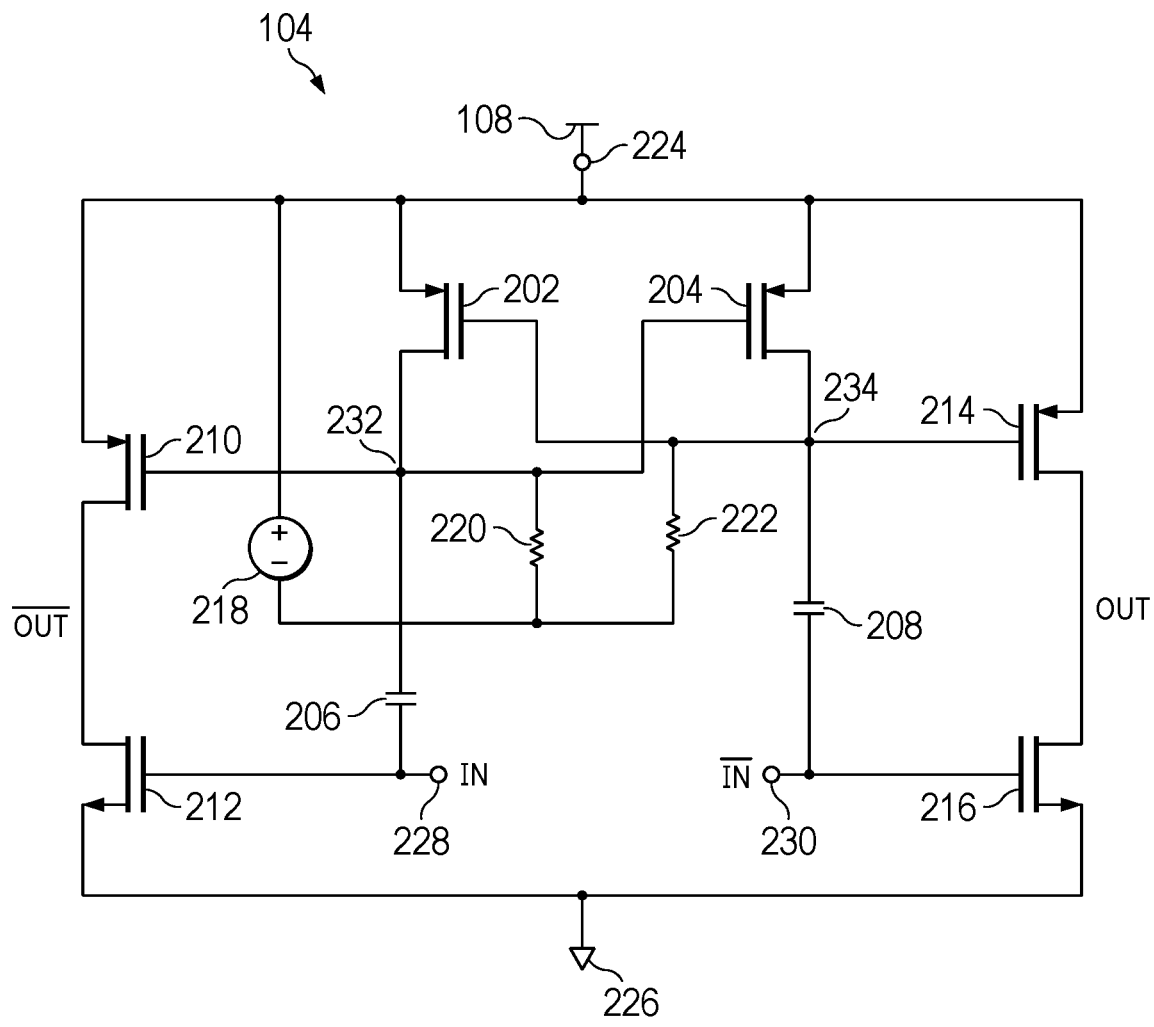
FIG. 2 is a schematic diagram of an example level shifter.

FIG. 2 is a schematic diagram of an example of the level shifter 104. In an example, the level shifter 104 of FIG. 2 includes a transistor 202 and a transistor 204 that together form a cross-coupled input pair, a capacitor 206, a capacitor 208, a transistor 210, a transistor 212, a transistor 214, a transistor 216, a voltage source 218, a resistor 220, and a resistor 222.

In an example architecture of the level shifter 104, the transistor 202 has a source coupled to a terminal 224, a gate, and a drain. The transistor 204 has a source coupled to the terminal 224, a gate coupled to the drain of the transistor 202, and a drain coupled to the gate of the transistor 202. The capacitor 206 is coupled between the drain of the transistor 202 and a node 228. The capacitor 208 is coupled between the drain of the transistor 204 and a node 230. The transistor 210 has a source coupled to the terminal 224, a gate coupled to the drain of the transistor 202, and a drain. The transistor 212 has a drain coupled to the drain of the transistor 210, a gate coupled to the node 228, and a source coupled to a ground terminal 226. The transistor 214 has a source coupled to the terminal 224, a gate coupled to the drain of the transistor 204, and a drain. The transistor 216 has a drain coupled to the drain of the transistor 214, a gate coupled to the node 230, and a source coupled to the ground terminal 226. In an example, the terminal 224 is coupled to the first power supply 108. In an example, an input signal (IN) is received at the node 228 and an inverse of the input signal (IN) is received at the node 230. An output signal (OUT) of the level shifter 104 is provided at the drain of the transistor 216 and an inverse of the output signal (OUT) is provided at the drain of the transistor 212. The voltage source 218 has a positive terminal coupled to the terminal 224, and a negative terminal. The resistor 220 is coupled between the drain of the transistor 202 and the negative terminal of the voltage source 218. The resistor 222 is coupled between the drain of the transistor 204 and the negative terminal of the voltage source 218. In some examples, an inverter (not shown) is coupled between the node 228 and the node 230 such that the inverter provides IN having an inverse value of IN.

In an example of operation of the level shifter 104 of FIG. 2, responsive to IN having a low value (e.g., a value of about 0 V), the transistor 202 is turned off and the transistor 204 is turned on. In some examples, the gate of the transistor 204 is driven by IN through the capacitor 206, such as via capacitive coupling, and the gate of the transistor 202 is driven by IN through the capacitor 208, also such as via capacitive coupling. The capacitor 208 charges through the transistor 204 to approximately a value of the signal provided at the terminal 224, providing this voltage at the node 234. The transistor 216 turns on, pulling down a value of OUT to approximately equal a value of a ground potential provided at the ground terminal 226. The transistor 214 may remain turned off resulting from the node 234 having approximately the value of the signal provided at the terminal 224. The transistor 210 may turn on resulting from the low value of IN being provided at the node 232, pulling up a value of OUT to approximately equal a value of the signal provided at the terminal 224. The transistor 212 may remain turned off resulting from IN having the low value.

Responsive to IN changing to have a high value (e.g., a value of about 1.1. V in the example of FIG. 2), the transistor 202 is turned on and the transistor 204 is turned off. The capacitor 206 charges through the transistor 202 to approximately a value of the signal provided at the terminal 224, providing this voltage at the node 232. The transistor 212 turns on, pulling down a value of OUT to approximately equal a value of a ground potential provided at the ground terminal 226. The transistor 210 may remain turned off resulting from the node 232 having approximately the value of the signal provided at the terminal 224. The transistor 214 may turn on resulting from the low value of IN being provided at the node 234, pulling up a value of OUT to approximately equal a value of the signal provided at the terminal 224. The transistor 216 may remain turned off resulting from IN having the low value.

As described above, in an example, drain leakage of the transistor 202 and the transistor 204 may cause the node 232 and the node 234, respectively, to drift or leak up to a value of the signal provided at the terminal 224 in the absence of the voltage source 218, the resistor 220, and the resistor 222. This may adversely affect operation of the level shifter 104, such as by causing inaccurate values to be provided at the node 232 and/or the node 234 (e.g., values at the node 232 and/or the node 234 not provided based on values of IN or IN). To mitigate or otherwise compensate for this drain leakage, the resistor 220 pulls down the drain of the transistor 202 and the resistor 222 pulls down the drain of the transistor 204. In an example, the resistor 220 and the resistor 222 pull down the respective drains to a voltage provided by the voltage source 218. In some examples, the voltage source 218 provides a voltage based on voltages provided by the first power supply 108 and the second power supply 110. For example, the voltage source 218 may have approximately the same voltage value as the first power supply 108 such that, coupled as shown in FIG. 2, a value approximately equal to a voltage provided by the second power supply 110 minus a voltage provided by the first power supply 108 is provided at the negative terminal of the voltage source 218. The resistor 220 and the resistor 222 pull down the respective drains to this voltage, which in some examples is equal to about 0.7 V (such as in examples in which the first power supply 108 provides a signal having a voltage of about 1.1 V and the second power supply 110 provides a signal having a voltage of about 1.8 V). In other examples, the voltage source 218 may provide any other suitable voltage at its negative terminal. Because the drains of the transistor 202 and the transistor 204 are pulled down through the resistor 220 and the resistor 222, respectively, to a bias voltage provided by the voltage source 218, the drains do not drift or leak up to a value of the signal provided at the terminal 224.

Figure 3:
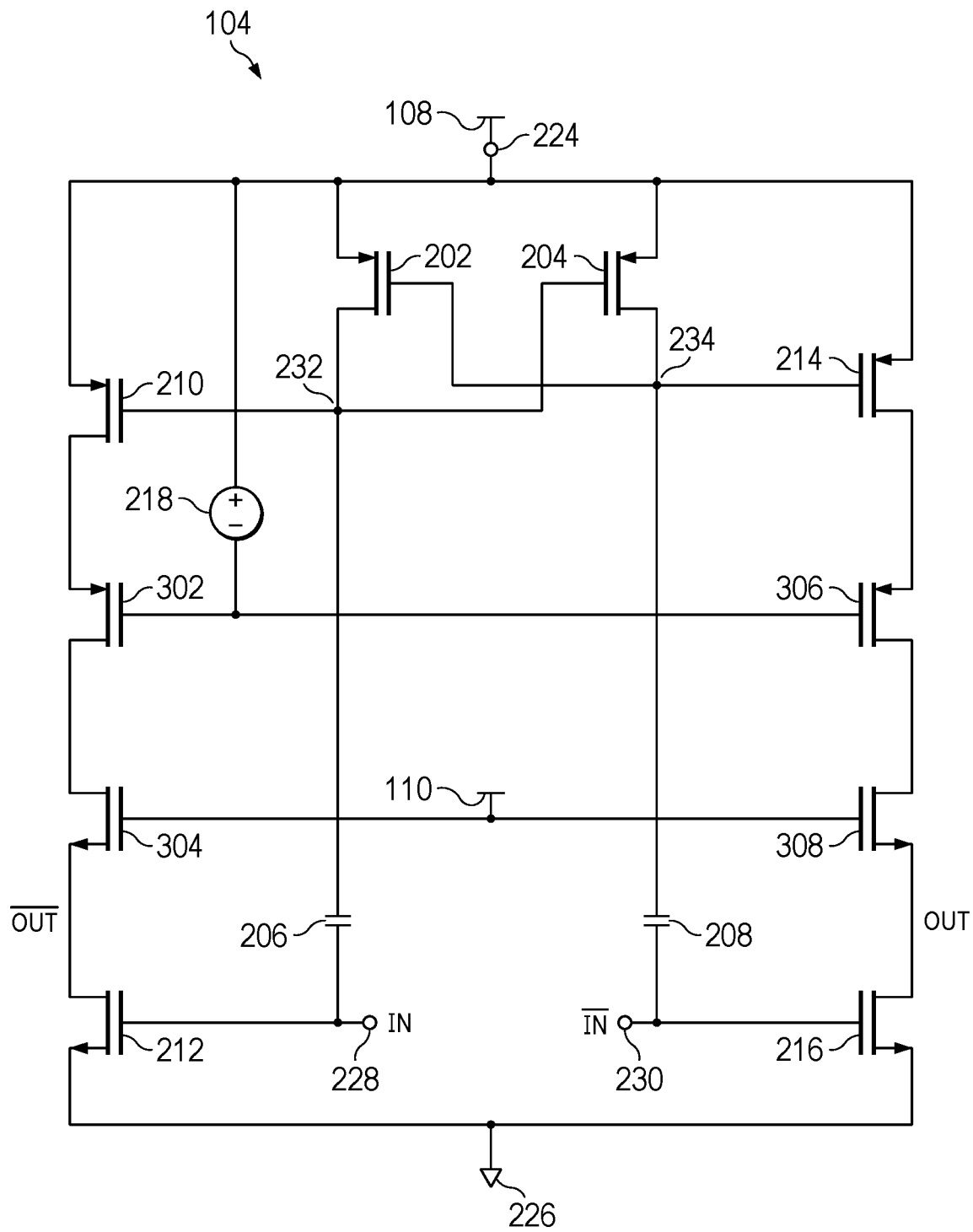
FIG. 3 is a schematic diagram of an example level shifter.

FIG. 3 is a schematic diagram of an example of the level shifter 104. In an example, the level shifter 104 of FIG. 3 includes the transistor 202 and the transistor 204 that together form a cross-coupled input pair, the capacitor 206, the capacitor 208, the transistor 210, the transistor 212, the transistor 214, the transistor 216, and the voltage source 218, each of which is coupled and operates substantially as described above with respect to FIG. 2, except as otherwise stated with respect to FIG. 3. The level shifter 104 of FIG. 3 also includes a transistor 302, a transistor 304, a transistor 306, and a transistor 308.

In an example architecture of the level shifter 104 of FIG. 3, the transistor 302 has a source coupled to the drain of the transistor 210, a gate coupled to the negative terminal of the voltage source 218, and a source. The transistor 304 has a drain coupled to the drain of the transistor 302, a source coupled to the drain of the transistor 212, and a gate. The transistor 306 has a source coupled to the drain of the transistor 214, a gate coupled to the negative terminal of the voltage source 218, and a source. The transistor 308 has a drain coupled to the drain of the transistor 306, a source coupled to the drain of the transistor 216, and a gate coupled to the gate of the transistor 304. In an example, the gate of the transistor 304 and the gate of the transistor 308 are coupled to the second power supply 110. An output signal (OUT) of the level shifter 104 of FIG. 3 is provided at the drain of the transistor 306 and an inverse of the output signal ($\overline{\text{OUT}}$) is provided at the drain of the transistor 302.

General operation of the level shifter 104 for the transistor 202 and the transistor 204 that together form a cross-coupled input pair, the capacitor 206, the capacitor 208, the transistor 210, the transistor 212, the transistor 214, the transistor 216, and the voltage source 218 is described above with respect to FIG. 2, and is not repeated herein with respect to FIG. 3. In an example, the transistor 210, the transistor 212, the transistor 214, the transistor 216, the transistor 302, the transistor 304, the transistor 306, and the transistor 308 may have a maximum voltage rating approximately equal to a value of the voltage provided by the first power supply 108 (or otherwise less than the value of the voltage provided by the second power supply 110). This may allow for the level shifter 104 of FIG. 3 to have a reduced size, and correspondingly reduced cost, than another level shifter of similar architecture but implementing the transistor 210, the transistor 212, the transistor 214, the transistor 216, the transistor 302, the transistor 304, the transistor 306, and the transistor 308 having a maximum voltage rating approximately equal to a value of the voltage provided by the second power supply 110. Also, this may allow for faster operation of the level shifter 104 of FIG. 3 than another level shifter of similar architecture but implementing the transistor 210, the transistor 212, the transistor 214, the transistor 216, the transistor 302, the transistor 304, the transistor 306, and the transistor 308 having a maximum voltage rating approximately equal to a value of the voltage provided by the second power supply 110.

In some examples, the transistor 302 and the transistor 306 are each protection devices that protect the transistor 210 and the transistor 214, respectively. For example, gates of the transistor 302 and the transistor 306 are biased by the voltage source 218 such that the transistor 210 and the transistor 214 are prevented from having a drain-to-source voltage (Vds) of greater than 1.1 V (or another voltage determined according to a safe operating range or maximum voltage rating of the transistor 210 and the transistor 214), thereby preventing the transistor 210 or the transistor 214 from experiencing an overvoltage event. Similarly, the transistor 304 and the transistor 308 are each protection devices that protect the transistor 212 and the transistor 216, respectively. For example, gates of the transistor 304 and the transistor 308 are biased by the second power supply 110 such that the transistor 212 and the transistor 216 are prevented from having a Vds of greater than 1.1 V (or another voltage determined according to a safe operating range or maximum voltage rating of the transistor 212 and the transistor 216), thereby preventing the transistor 212 or the transistor 216 from experiencing an overvoltage event. In this way, the transistors 210, 212, 214, and 216 are protected from overvoltage events by the transistors 302, 304, 306, and 308, allowing the transistors 210, 212, 214, and 216 to be implemented as smaller devices having lower maximum voltage ratings. This reduces size and cost, and facilitates increased operational speed, as described above.

Figure 4:
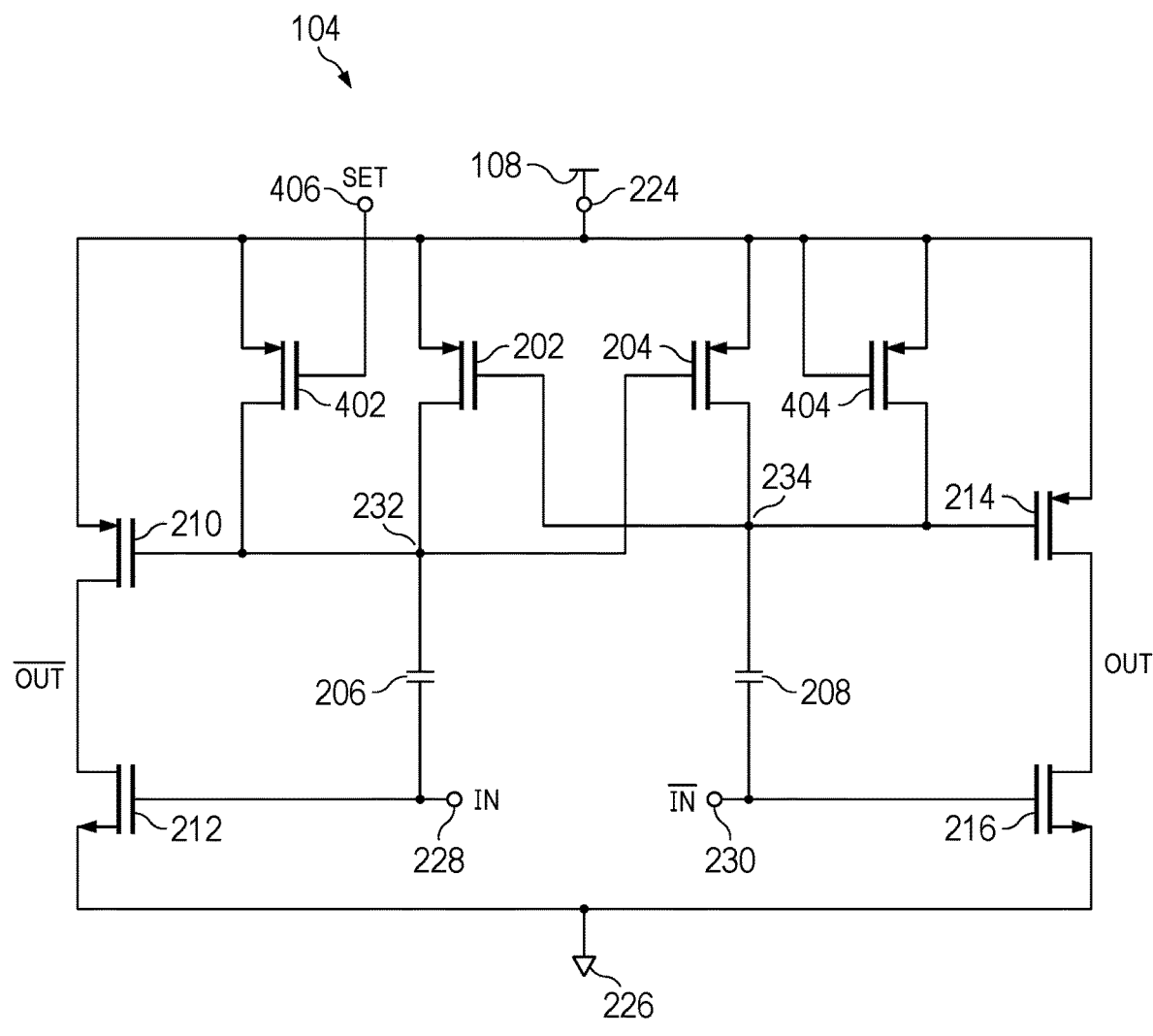
FIG. 4 is a schematic diagram of an example level shifter.

FIG. 4 is a schematic diagram of an example of the level shifter 104. In an example, the level shifter 104 of FIG. 4 includes the transistor 202 and the transistor 204 that together form a cross-coupled input pair, the capacitor 206, the capacitor 208, the transistor 210, the transistor 212, the transistor 214, and the transistor 216, each of which is coupled and operates substantially as described above with respect to FIG. 2, except as otherwise stated with respect to FIG. 4. The level shifter 104 of FIG. 4 also includes a transistor 402 and a transistor 404.

In an example architecture of the level shifter 104 of FIG. 4, the transistor 402 has a source coupled to the terminal 224, a drain coupled to the node 232, and a gate coupled to a terminal 406. The transistor 404 has a source coupled to the terminal 224, a drain coupled to the node 234, and a gate coupled to the terminal 224. In an example, a pre-charge control signal (SET) is received at the terminal 406 from any suitable source.

General operation of the level shifter 104 for the transistor 202 and the transistor 204 that together form a cross-coupled input pair, the capacitor 206, the capacitor 208, the transistor 210, the transistor 212, the transistor 214, the transistor 216, and the voltage source 218 is described above with respect to FIG. 2, and is not repeated herein with respect to FIG. 4. In some examples, at startup of the level shifter 104, the node 232 may not be initialized until an input signal is received. For example, a value of a signal provided at the node 232 may not be known or controllable until a first edge of IN or $\overline{IN}$ is received at the node 228 or the node 230, respectively. As described above, this may result in glitches in a value of OUT, or other adverse effects on operation of the level shifter 104. In some examples, the node 232 may be pulled-up or pre-charged to initialize the node 232 prior to receipt of a first edge of IN or $\overline{IN}$. For example, responsive to SET having a deasserted (e.g., logic level low) value, the transistor 402 becomes conductive, coupling the node 232 to the terminal 224, pre-charging the node 232 to approximately the same value as provided at the terminal 224. Subsequently, and prior to receipt of a receipt of a first edge of IN or $\overline{IN}$, SET may be asserted to turn off the transistor 402. In some examples, the pre-charging prevents the node 232 from having an unknown value due to not being initialized, mitigating the occurrence of glitches in, or erroneous values of, OUT. In some examples, the transistor 404 has substantially similar characteristics as the transistor 402 and is included in the level shifter 104 of FIG. 4 to cause parasitic characteristics at the node 232 and the node 234 to be approximately the same. As such, the transistor 404 may be referred to as a dummy device. In other examples, the transistor 404 may be omitted or may be replaced by any other suitable component(s).

Figure 5:
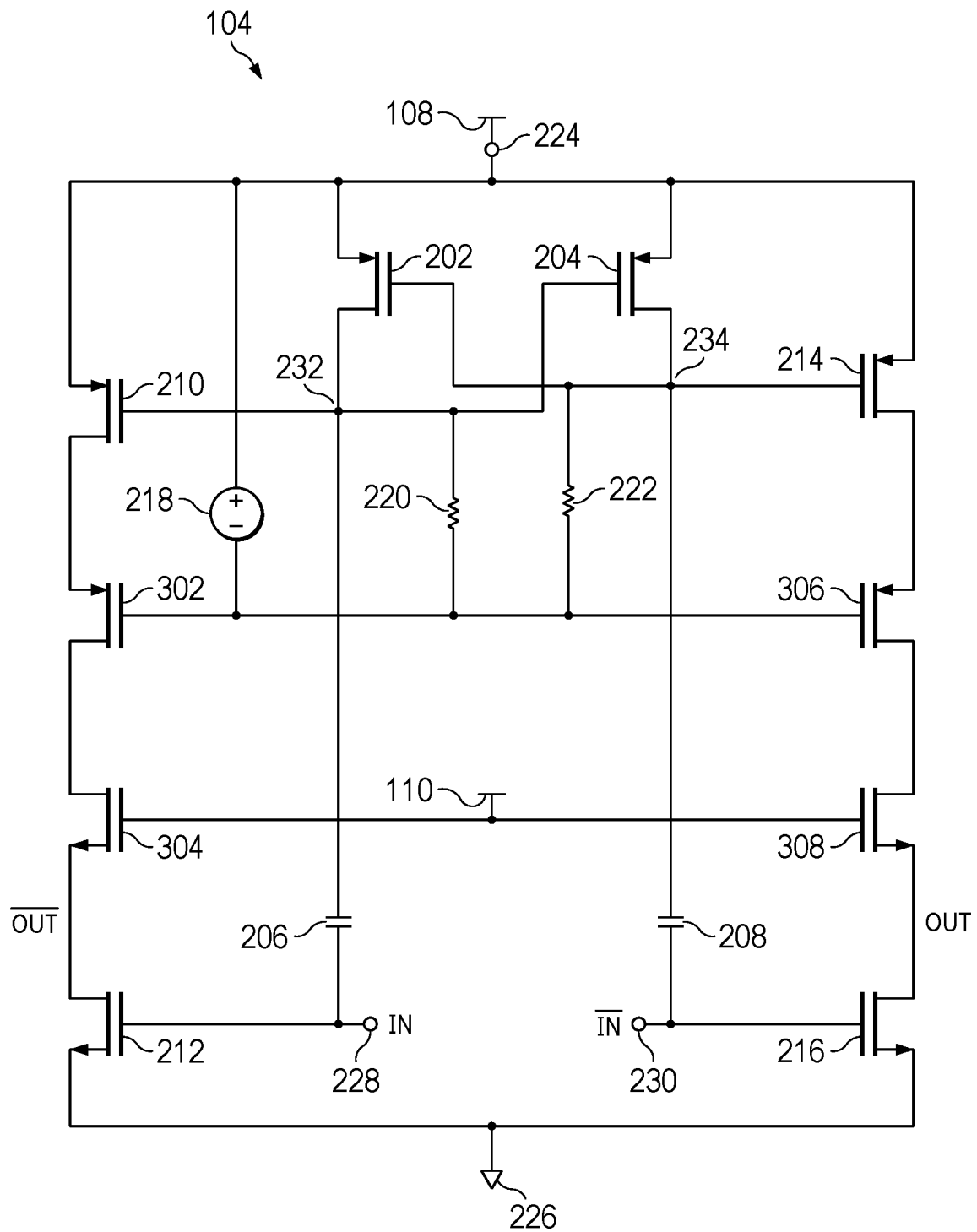
FIG. 5 is a schematic diagram of an example level shifter.
Figure 6:
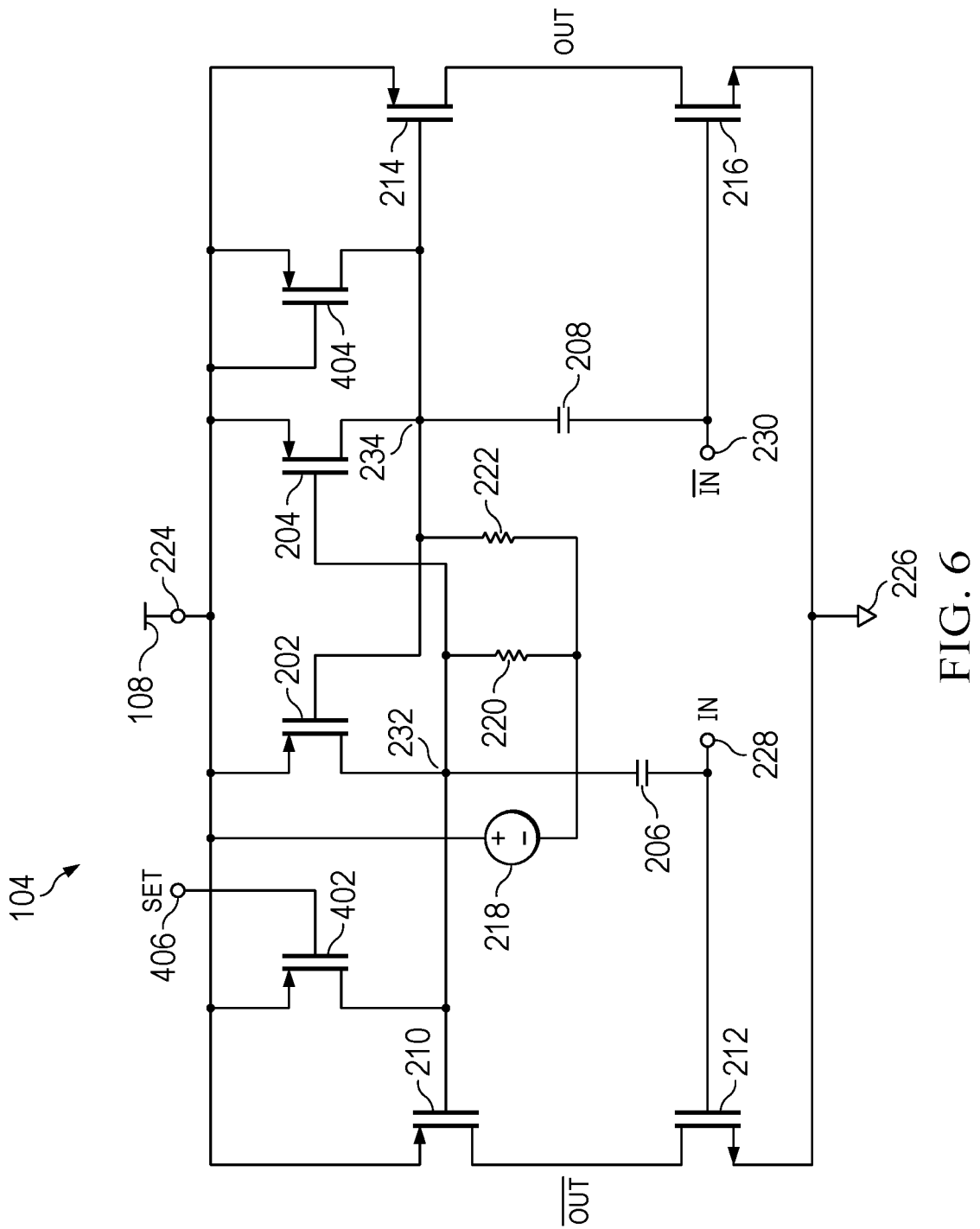
FIG. 6 is a schematic diagram of an example level shifter.
Figure 7:
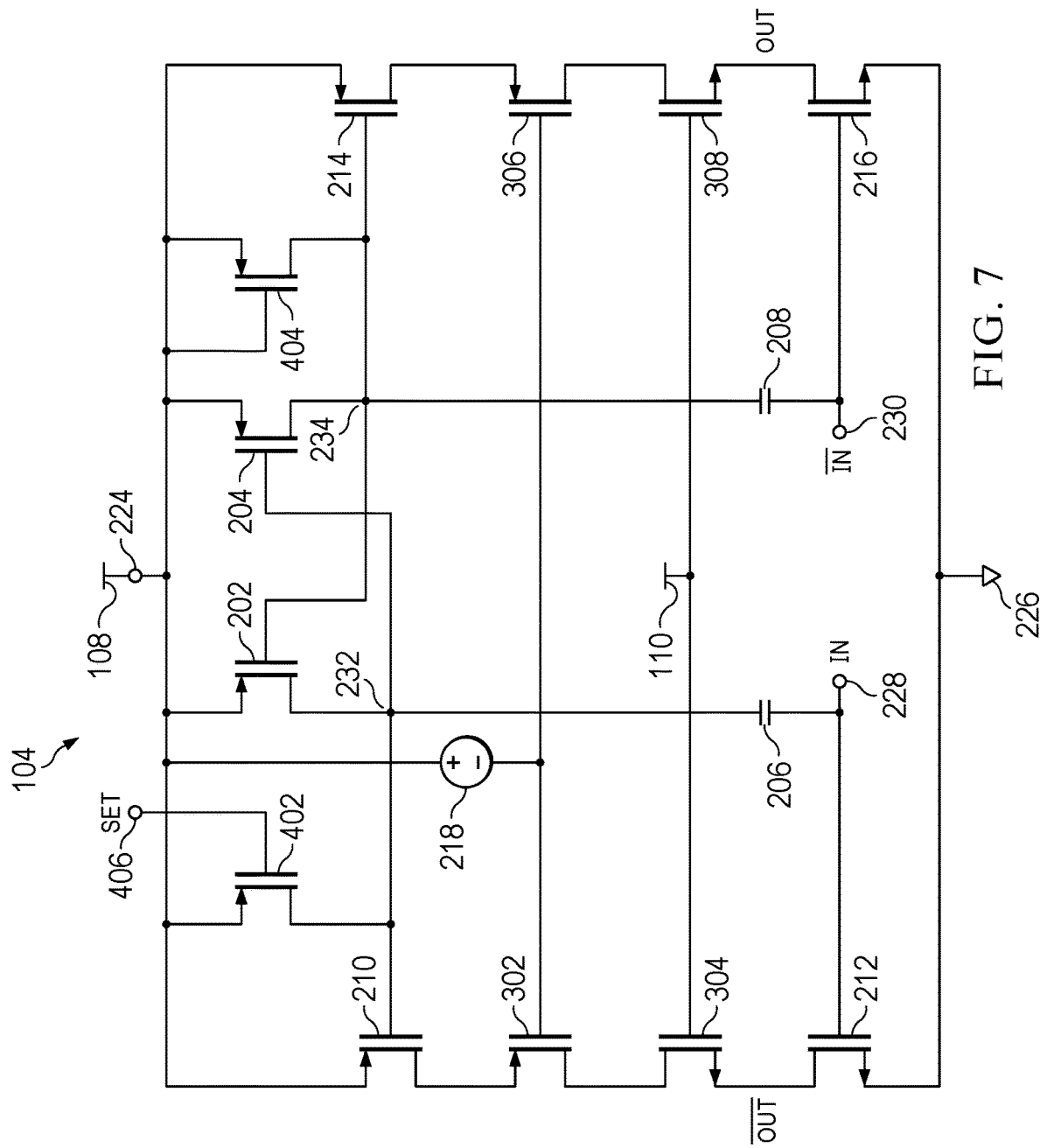
FIG. 7 is a schematic diagram of an example level shifter.
Figure 8:
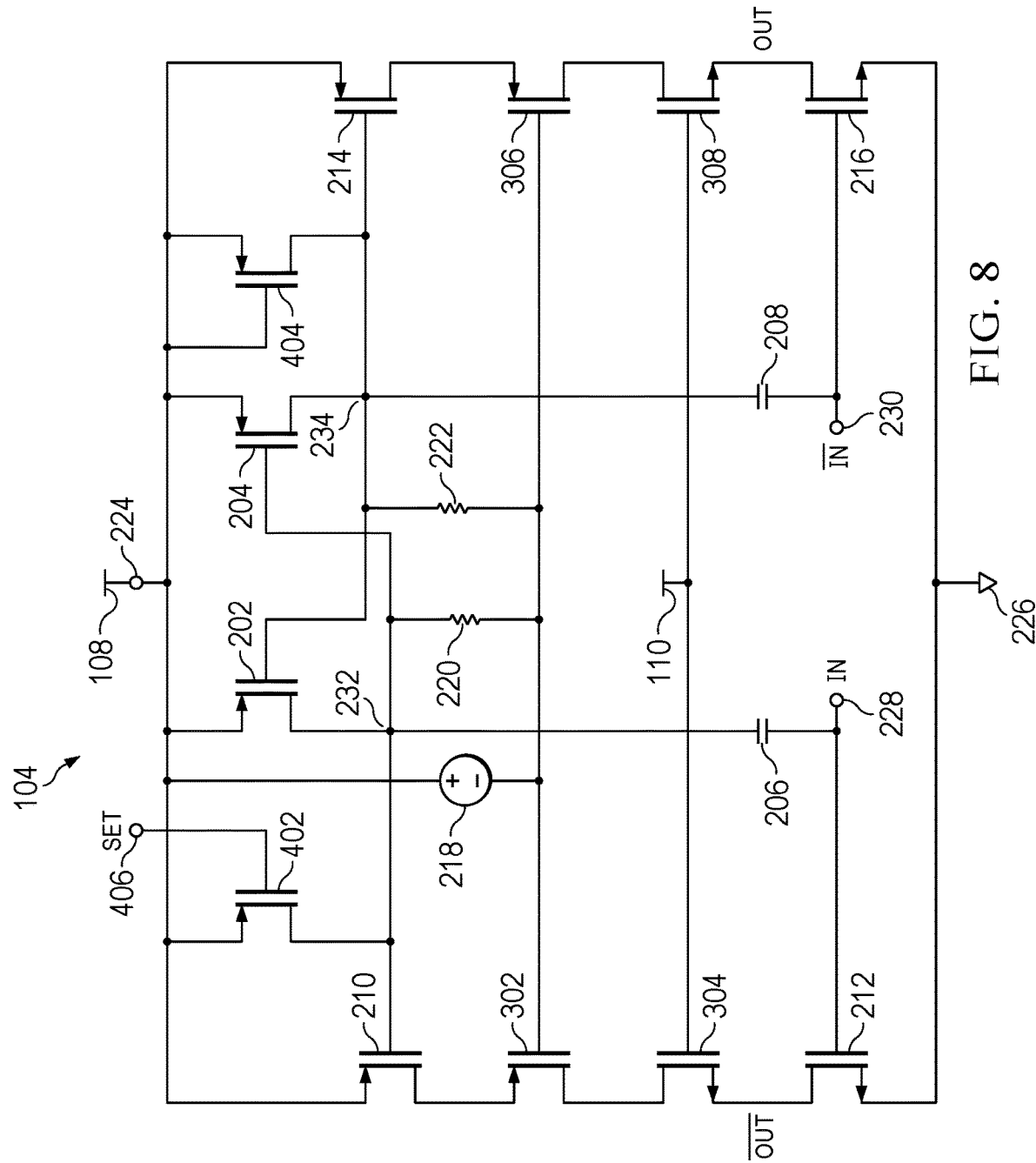
FIG. 8 is a schematic diagram of an example level shifter.

Various combinations of the features described above with respect to FIGS. 2, 3, and 4 may be possible. Such combinations may provide a level shifter that mitigates or compensates for multiple of the challenges described herein, increase performance of the level shifter, or make the level shifter more suitable for an application environment. For example, FIG. 5 is a schematic diagram of an example of the level shifter 104. The level shifter 104 of FIG. 5 combines the features of the level shifter 104 of FIG. 2 and the level shifter 104 of FIG. 3. Similarly, FIG. 6 is a schematic diagram of an example of the level shifter 104. The level shifter 104 of FIG. 6 combines the features of the level shifter 104 of FIG. 2 and the level shifter 104 of FIG. 4. FIG. 7 is a schematic diagram of an example of the level shifter 104. The level shifter 104 of FIG. 7 combines the features of the level shifter 104 of FIG. 3 and the level shifter 104 of FIG. 4. FIG. 8 is a schematic diagram of an example of the level shifter 104. The level shifter 104 of FIG. 8 combines the features of the level shifter 104 of FIG. 2, the level shifter 104 of FIG. 3, and the level shifter 104 of FIG. 4.

Figure 9:
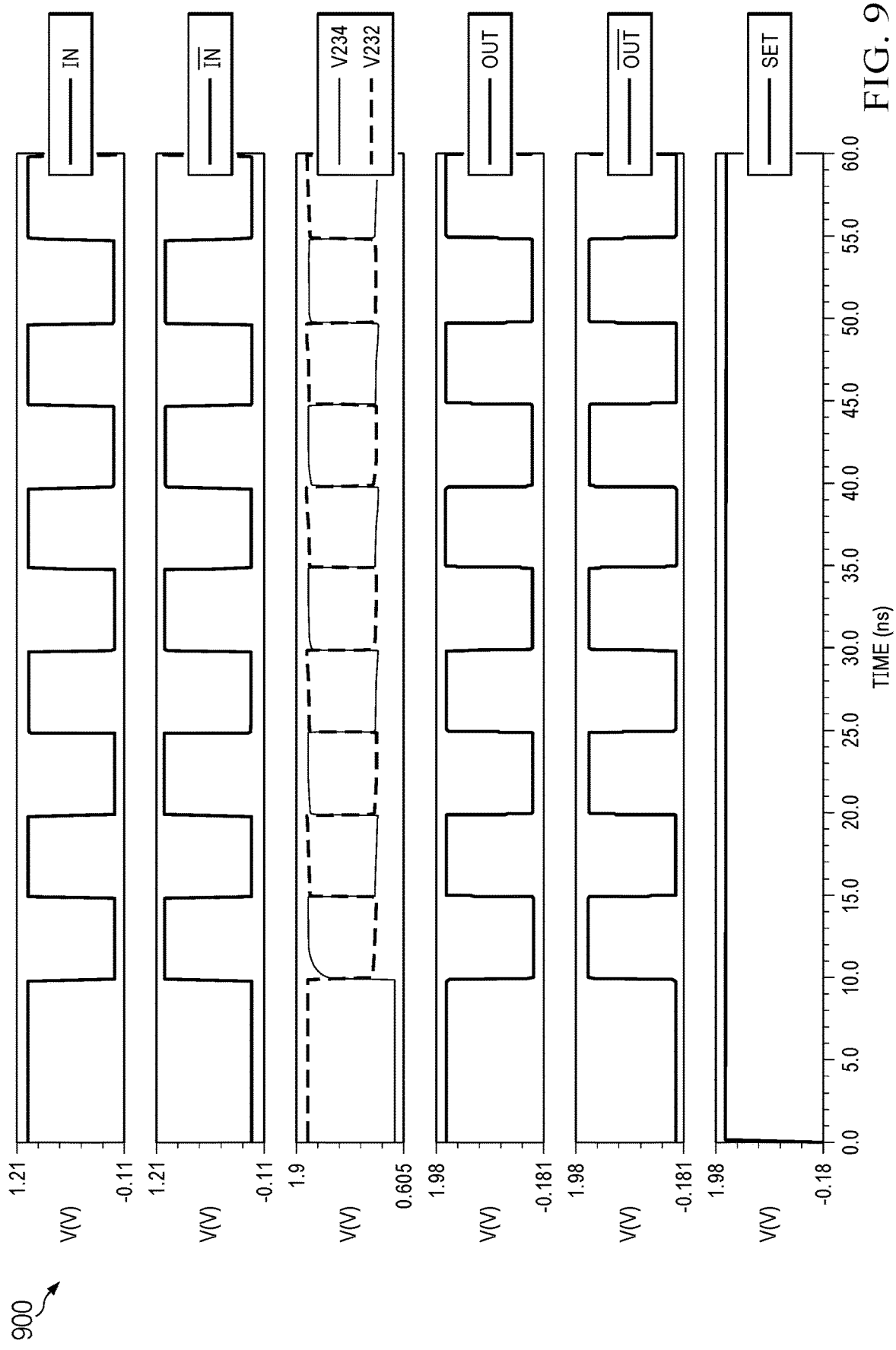
FIG. 9 is a timing diagram of example signals in a system implementing level shifting.

FIG. 9 is a timing diagram 900 of example signals in a system implementing level shifting. In an example, the diagram 900 is representative of at least some signals that may be present in the level shifter 104 of FIG. 8. The diagram 900 includes IN, $\overline{IN}$, a voltage provided at the node 232 (V232), a voltage provided at the node 234 (V234), OUT, $\overline{OUT}$, and SET. Each signal of the diagram 900 is shown having a vertical axis representative of voltage in units of V and a horizontal axis representative of time in units of nanoseconds (ns).

As shown in the diagram 900, responsive to SET having a deasserted value, V232 is pre-charged to approximately equal a value of the signal provided at the terminal 224, which in this example is about 1.8 V, after which SET is asserted to turn off the transistor 402 prior to receipt of the first edge of IN or $\overline{IN}$. Subsequently, IN is received having a falling edge and $\overline{IN}$ is correspondingly received having a rising edge. The falling edge of IN causes V232 to decrease in value to approximately a same voltage as provided at the negative terminal of the voltage source 218, which causes $\overline{OUT}$ to be provided having a value approximately equal to a value of the signal provided at the terminal 224. Similarly, the rising edge in $\overline{IN}$ causes V234 to increase in value to approximately a same voltage as the signal provided at the terminal 224, which causes OUT to be provided having a value of approximately 0 V, or a ground potential.

Responsive to IN being received having a rising edge, V232 increases in value to approximately equal to a value of the signal provided at the terminal 224, which causes $\overline{OUT}$ to be provided having a value of approximately 0 V, or a ground potential. Similarly, the falling edge in $\overline{IN}$ causes V234 to decrease in value to approximately a same voltage as provided at the negative terminal of the voltage source 218, which causes OUT to be provided having a value approximately equal to a value of the signal provided at the terminal 224.

In this description, the term "couple" may cover connections, communications, or signal paths that enable a functional relationship consistent with this description. For example, if device A provides a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal provided by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. An apparatus, comprising:
a first transistor having a first gate, a first source, and a first drain, in which the first source is coupled to a first voltage terminal;
a second voltage terminal;
a resistor coupled between the first gate and the second voltage terminal;
a second transistor having a second gate, a second source, and a second drain, in which the second gate is coupled to the first drain, and the second source is coupled to the first voltage terminal;
a third transistor having a third gate, a third source, and a third drain, in which the third drain is coupled to the second drain, and the third source is coupled to a ground terminal; and
a capacitor coupled between the first drain and the third gate.

2. The apparatus of claim 1, further comprising a fourth transistor having a fourth gate, a fourth source, and a fourth drain, in which the fourth gate is coupled to the resistor and the second voltage terminal, the fourth source is coupled to the second drain, and the fourth drain is coupled to the third drain.

3. The apparatus of claim 1, further comprising a fourth transistor having a fourth gate, a fourth source, and a fourth drain, in which the fourth gate is coupled to a third voltage terminal, the fourth drain is coupled to the second drain, and the fourth source is coupled to the third drain.

4. The apparatus of claim 3, further comprising a fifth transistor having a fifth gate, a fifth source, and a fifth drain, in which the fifth gate is coupled to the resistor and the second voltage terminal, the fifth source is coupled to the second drain, and the fifth drain is coupled to the fourth drain.

5. The apparatus of claim 1, further comprising a fourth transistor having a fourth gate, a fourth source, and a fourth drain, in which the fourth source is coupled to the first voltage terminal, the fourth drain is coupled to the first drain, and the fourth gate is coupled to a first control terminal.

6. An apparatus, comprising:
a first voltage terminal;
a first transistor having a first gate, a first source, and a first drain, in which the first source is coupled to a second voltage terminal;
a second transistor having a second gate, a second source, and a second drain, in which the second gate is coupled to the first drain, and the second source is coupled to the second voltage terminal;
a third transistor having a third gate, a third source, and a third drain, wherein the third gate is coupled to the first voltage terminal and the third source is coupled to the second drain;
a fourth transistor having a fourth gate, a fourth source, and a fourth drain, in which the fourth gate is coupled to a third voltage terminal, and the fourth drain is coupled to the third drain;
a capacitor; and
a fifth transistor having a fifth gate, a fifth source, and a fifth drain, in which the capacitor is coupled between the fifth gate and the first drain, the fifth drain is coupled to the fourth source, and the fifth source is coupled to a ground terminal.

7. The apparatus of claim 6, further comprising a resistor coupled between the first gate and the third gate.

8. The apparatus of claim 6, further comprising a sixth transistor having a sixth gate, a sixth source, and a sixth drain, in which the sixth gate is coupled to a control terminal, the sixth source is coupled to the second voltage terminal, and the sixth drain is coupled to the first drain.

9. A system, comprising:
a circuit having:
a first transistor having a first gate, a first source, and a first drain, in which the first source is coupled to a first voltage terminal;
a second transistor having a second gate, a second source, and a second drain, in which the second gate is coupled to the first drain, and the second source is coupled to the first voltage terminal;
a third transistor having a third gate, a third source, and a third drain, in which the third drain is coupled to the second drain, and the third source is coupled to a ground terminal;
a capacitor coupled between the first drain and the third gate; and
a fourth transistor having a fourth gate, a fourth source, and a fourth drain, in which the fourth gate is coupled to a first control terminal, the fourth source is coupled to the first voltage terminal, and the fourth drain is coupled to the first drain.

10. The system of claim 9, wherein the circuit has:
a voltage source; and
a resistor coupled between the first gate and the first voltage source, wherein the voltage source is coupled between the resistor and the first voltage terminal.

11. The system of claim 9, wherein the circuit has:
a voltage source;
a fifth transistor having a fifth gate, a fifth source, and a fifth drain, in which the voltage source is coupled between the fifth gate and the first voltage terminal, and the fifth source is coupled to the second drain; and a sixth transistor having a sixth gate, a sixth source, and a sixth drain, in which the sixth gate is coupled to a second voltage terminal, the sixth drain is coupled to the fifth drain, and the sixth source is coupled to the third drain.

12. The system of claim 11, wherein the circuit has a resistor coupled between the first gate and the fifth gate.

13. The system of claim 12, wherein the voltage source has a positive terminal and a negative terminal, in which the positive terminal is coupled to the first voltage terminal and the negative terminal is coupled to the fifth gate.

14. The system of claim 9, wherein the circuit has:
a fifth transistor having a fifth gate, a fifth source, and a first drain, in which the fifth gate is coupled to the first drain, the fifth source is coupled to the first voltage terminal, and the fifth drain is coupled to the first gate;
a sixth transistor having a sixth gate, a sixth source, and a sixth drain, in which the sixth gate is coupled to the fifth drain, and the sixth source is coupled to the first voltage terminal;
a seventh transistor having a seventh gate, a seventh source, and a seventh drain, in which the seventh drain is coupled to the sixth drain, and the seventh source is coupled to the ground terminal;
a second capacitor coupled between the fifth drain and the seventh gate; and
an eighth transistor having an eighth gate, an eighth source, and an eighth drain, in which the eighth gate is coupled to the first voltage terminal, the eighth source is coupled to the first voltage terminal, and the eighth drain is coupled to the fifth drain.

15. The system of claim 14, wherein the circuit has:
a second resistor coupled between the fifth gate and the first voltage source, wherein the voltage source is coupled between the second resistor and the first voltage terminal.

16. The system of claim 14, wherein the circuit has:
a voltage source;
a ninth transistor having a ninth gate, a ninth source, and a ninth drain, in which the voltage source is coupled between the ninth gate and the first voltage terminal, and the ninth source is coupled to the sixth drain; and
a tenth transistor having a tenth gate, a tenth source, and a tenth drain, in which the tenth gate is coupled to a second voltage terminal, the tenth drain is coupled to the ninth drain, and the tenth source is coupled to the seventh drain.

17. The system of claim 16, wherein the circuit has a second resistor coupled between the fifth gate and the ninth gate.

18. The system of claim 16, wherein the third gate and the seventh gate form first and second differential inputs of the circuit, the system further comprising a first device coupled to the first and second differential inputs and configured to provide an input signal having a first peak-to-peak voltage.

19. The system of claim 18, wherein the circuit has:
an eleventh transistor having an eleventh gate, an eleventh source, and an eleventh drain, in which the voltage source is coupled between the eleventh gate and the first voltage terminal, and the eleventh source is coupled to the sixth drain; and
a twelfth transistor having a twelfth gate, a twelfth source, and a twelfth drain, in which the twelfth gate is coupled to the second voltage terminal, the twelfth drain is coupled to the eleventh drain, and the twelfth source is coupled to the seventh drain,
wherein the twelfth drain and the tenth drain form first and second differential outputs of the circuit, the system further comprising a second device coupled to the first and second differential outputs, wherein the circuit is configured to provide an output signal having a second peak-to-peak voltage at the first and second differential outputs.

20. The system of claim 14, wherein the first transistor and the fifth transistor form a cross-coupled input pair of a level-shifter.

* * * * *